(12) United States Patent
Park et al.

(10) Patent No.: US 10,414,925 B2
(45) Date of Patent: *Sep. 17, 2019

(54) UV-CURABLE INK COMPOSITION, METHOD FOR PRODUCING BEZEL PATTERN OF DISPLAY SUBSTRATE USING SAME, AND BEZEL PATTERN PRODUCED THEREBY

(71) Applicant: LG CHEM, LTD., Seoul (KR)

(72) Inventors: Sung-Eun Park, Daejeon (KR); Yong-Sung Goo, Daejeon (KR); Seung-A Back, Daejeon (KR); Joon-Hyung Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 147 days.

This patent is subject to a terminal disclaimer.

(21) Appl. No.: 15/501,398

(22) PCT Filed: Sep. 30, 2015

(86) PCT No.: PCT/KR2015/010344
§ 371 (c)(1),
(2) Date: Feb. 2, 2017

(87) PCT Pub. No.: WO2016/048118
PCT Pub. Date: Mar. 31, 2016

(65) Prior Publication Data
US 2017/0218212 A1   Aug. 3, 2017

(30) Foreign Application Priority Data

Sep. 26, 2014   (KR) ................. 10-2014-0129417
Sep. 30, 2015   (KR) ................. 10-2015-0138097

(51) Int. Cl.
| | | |
|---|---|---|
| C09D 11/101 | (2014.01) | |
| B41M 7/00 | (2006.01) | |
| C09D 11/03 | (2014.01) | |
| C09D 11/102 | (2014.01) | |
| C09D 11/36 | (2014.01) | |
| C09D 11/38 | (2014.01) | |
| B41F 17/00 | (2006.01) | |
| C09D 11/037 | (2014.01) | |
| C09D 11/324 | (2014.01) | |
| G09F 9/00 | (2006.01) | |
| C08F 2/48 | (2006.01) | |
| B41J 11/00 | (2006.01) | |
| H05K 1/09 | (2006.01) | |
| H05K 3/12 | (2006.01) | |
| C09D 11/00 | (2014.01) | |
| C09D 171/00 | (2006.01) | |

(52) U.S. Cl.
CPC .......... *C09D 11/101* (2013.01); *B41F 17/006* (2013.01); *B41J 11/002* (2013.01); *B41M 7/00* (2013.01); *B41M 7/009* (2013.01); *C08F 2/48* (2013.01); *C09D 11/00* (2013.01); *C09D 11/03* (2013.01); *C09D 11/037* (2013.01); *C09D 11/102* (2013.01); *C09D 11/324* (2013.01); *C09D 11/36* (2013.01); *C09D 11/38* (2013.01); *C09D 171/00* (2013.01); *G09F 9/00* (2013.01); *H05K 1/092* (2013.01); *H05K 3/12* (2013.01); *H05K 3/125* (2013.01); *H05K 3/1275* (2013.01); *H05K 2203/0534* (2013.01)

(58) Field of Classification Search
None
See application file for complete search history.

(56) References Cited

U.S. PATENT DOCUMENTS

| | | | |
|---|---|---|---|
| 8,197,053 B2 | 6/2012 | Miura et al. | |
| 10,227,498 B2* | 3/2019 | Park | B41M 7/00 |
| 2002/0188033 A1* | 12/2002 | Maeda | C08G 59/24 522/31 |
| 2011/0195194 A1 | 8/2011 | Loccufier | |
| 2012/0202145 A1* | 8/2012 | Arayama | G03F 7/027 430/7 |
| 2013/0177719 A1 | 7/2013 | Tasaka et al. | |
| 2014/0186592 A1* | 7/2014 | Jeon | B32B 5/16 428/195.1 |

FOREIGN PATENT DOCUMENTS

| | | |
|---|---|---|
| CN | 1841197 A | 10/2006 |
| CN | 101546121 A | 9/2009 |
| CN | 102257432 A | 11/2011 |
| CN | 103025839 A | 4/2013 |
| EP | 2623575 A1 | 8/2013 |
| EP | 2774942 A1 | 9/2014 |
| JP | 2010013596 A | 1/2010 |
| JP | 2010-106254 A | 5/2010 |
| JP | 5117002 B | 1/2013 |
| JP | 2013147568 A | 8/2013 |
| JP | 5488175 B2 | 5/2014 |
| JP | 2014-148580 A | 8/2014 |
| KR | 1020130132322 A | 12/2013 |
| KR | 1020140086584 A | 7/2014 |
| KR | 1020140099560 A | 8/2014 |
| WO | 2010/069754 A1 | 6/2010 |
| WO | 2014010884 A1 | 1/2014 |

* cited by examiner

*Primary Examiner* — Joshua D Zimmerman
(74) *Attorney, Agent, or Firm* — Dentons US LLP

(57) ABSTRACT

The present invention relates to a UV-curable ink composition, a method for producing a bezel pattern of a display substrate using same, and a bezel pattern produced thereby, the UV-curable ink composition comprising a colorant, an epoxy compound, an oxetane compound, a photopolymerization initiator, and a surfactant comprising a polar functional group, wherein the content ratio of the epoxy compound to the oxetane compound is 1:0.5-1:6, an adhesion to a glass substrate after curing is 4B or higher according to the ASTM D3359 standard, a contact angle to the glass substrate is less than 10°, and an adhesion with a substrate coated with an adhesive layer after curing is 100-5,000 gf/25 mm.

25 Claims, No Drawings

UV-CURABLE INK COMPOSITION, METHOD FOR PRODUCING BEZEL PATTERN OF DISPLAY SUBSTRATE USING SAME, AND BEZEL PATTERN PRODUCED THEREBY

This application is a National Stage Application of International Application No. PCT/KR2015/010344, filed Sep. 30, 2015, and claims the benefit of Korean Patent Application No. 10-2015-0138097, filed Sep. 30, 2015, and Korean Patent Application No. 10-2014-0129417, and Sep. 26, 2014, the contents of which are incorporated herein by reference in their entirety for all purposes as if fully set forth below.

TECHNICAL FIELD

The present application claims the benefit of priority based on Korean Patent Application No. 10-2014-0129417 dated Sep. 26, 2014, Korean Patent Application No. 10-2014-0178523 dated Dec. 11, 2014, and Korean Patent Application No. 10-2015-0138097 dated Sep. 30, 2015, and all the contents disclosed in the literatures of the corresponding Korea patent applications are included as a part of the present specification.

The present invention relates to a UV-curable ink composition, a method for producing a bezel pattern of a display substrate using the same, and a bezel pattern produced thereby.

BACKGROUND ART

In a display device, a method for forming a bezel pattern on a substrate has been used instead of using a separate bezel structure in order to achieve the weight reduction and thinning In the method for producing a display substrate in the related art, a photolithography method or a screen printing method is used in order to form a bezel pattern, but in the case of the photography method, there is a disadvantage in that the production costs for forming a pattern are expensive, and the process is complicated. In the case of the screen printing method, the thickness of a formed pattern due to high viscosity of a composition is increased to several tens of μm, and accordingly, a step difference occurs between a pattern formation part and a pattern non-formation part. Furthermore, for a bezel part having a white or gold color instead of a black color, a bezel part is formed by using a method for recoating the color several times in order to obtain an optical density at a proper level, and as the printing frequency of the bezel pattern is increased as described above, the step difference between the pattern formation part and the pattern non-formation part is further increased.

In particular, in the case of a touch panel display in which a bezel pattern is disposed on an internal side surface of a display device, there occurs a problem in that when a transparent conductive film is coated, the conductive film is discontinuously coated or short-circuited. Further, when an upper base material such as a film in which an adhesive is applied on a bezel film is attached, problems such as generation of bubbles and peeling-off of the film may occur if the attaching force between the film and the bezel is insufficient. Therefore, there is a need for developing a method for forming a bezel pattern which has excellent attaching force with a film compared to the method for forming a bezel pattern in the related art.

DISCLOSURE

Technical Problem

Therefore, the present invention has been made keeping in mind the above problems encountered in the related art, and an object of the present invention is to provide a method for producing a bezel pattern, which minimizes generation of bubbles and the release of a film by using an UV-curable ink composition having a small taper angle and a thin film thickness and strong attaching force to a film on which an adhesive is applied to form a bezel pattern when the composition is cured, a bezel pattern produced thereby, and a display substrate including the same.

Technical Solution

In order to accomplish the above object, the present invention provides a UV-curable ink composition comprising a colorant, an epoxy compound, an oxetane compound, a photopolymerization initiator, and a surfactant comprising a polar functional group, wherein a content ratio of the epoxy compound to the oxetane compound is 1:0.5 to 1:6.

Further, the present invention provides a method for producing a bezel pattern for a display substrate, comprising: forming a bezel pattern on a substrate by using the UV-curable ink composition; and curing the bezel pattern.

In addition, the present invention provides a bezel pattern for a display substrate, which is formed on a substrate by curing the UV-curable ink composition.

Advantageous Effects

According to the present invention, it is possible to produce a bezel pattern which does not exhibit a short-circuit due to a large step difference and the deterioration in appearance quality according to the generation of bubbles and the release of the film by using a UV-curable ink composition which exhibits a small taper angle and a thin film thickness to form a bezel pattern when the composition is cured.

In the method for producing a bezel pattern of the present invention, the bezel pattern produced by using a UV-curable ink composition comprising a surfactant comprising a polar functional group has excellent adhesion force to a glass base material and excellent coatability, and excellent attaching force of a bezel film and a base material attached to an upper portion thereof.

BEST MODE

Hereinafter, the present invention will be described in more detail.

The present invention provides a UV-curable ink composition comprising a colorant, an epoxy compound, an oxetane compound, a photopolymerization initiator, and a surfactant comprising a polar functional group, wherein a content ratio of the epoxy compound to the oxetane compound is 1:0.5 to 1:6.

Further, the UV-curable ink composition of the present invention may further include one or more selected from the group consisting of an adhesion promoter, a colorant, and a photosensitizer.

In the UV-curable ink composition, a radical polymerizable resin and a cationic polymerizable resin may be usually used. The radical polymerizable resin is not suitable for curing of a thin film because of curing failure due to oxygen, and is not suitable for forming a bezel pattern because curing shrinkage is so large that adhesion to a glass base material is low. In contrast, the cationic polymerizable resin is advantageous in curing a thin film because the resin typically has low curing shrinkage and is slightly affected by oxygen.

The UV-curable ink composition used in the present invention includes an epoxy compound as a cationic curing component. The epoxy compound may be specifically one or a mixture of two selected from a bisphenol type epoxy compound, a novolac type epoxy compound, a glycidyl ester type epoxy compound, a glycidyl amine type epoxy compound, a linear aliphatic epoxy compound, a biphenyl type epoxy compound, and an alicyclic epoxy compound.

The alicyclic epoxy compound may mean a compound including one or more epoxidized aliphatic ring groups.

In the alicyclic epoxy compound including an epoxidized aliphatic ring group, the epoxidized aliphatic ring group means an epoxy group bonded to an alicyclic ring, and it is possible to exemplify a functional group, such as, for example, a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl) ethyl group, a 2-(3,4-epoxycyclohexyl)ethyl group, a 3-(3,4-epoxycyclopentyl)propyl group or a 3-(3,4-epoxycyclohexyl)propyl group. A hydrogen atom constituting the alicyclic ring may also be arbitrarily substituted with a substituent such as an alkyl group. As the alicyclic epoxy compound, for example, a compound to be specifically exemplified below may be used, but an available epoxy compound is not limited to the following types.

For example, it is possible to use dicyclopentadiene dioxide, cyclohexene oxide, 4-vinyl-1,2-epoxy-4-vinyl cyclohexene, vinyl cyclohexene dioxide, limonene monoxide, limonene dioxide, (3,4-epoxycyclohexyl)methyl-3,4-epoxycyclohexane carboxylate, 3-vinylcyclohexene oxide, bis(2,3-epoxycyclopentyl)ether, bis(3,4-epoxycyclohexyl methyl)adipate, bis (3,4-epoxy-6-methylcyclohexyl methyl) adipate, (3,4-epoxycyclohexyl)methyl alcohol, (3,4-epoxy-6-methylcyclohexyl)methyl-3,4-epoxy-6-methylcyclohexane carboxylate, ethylene glycol bis(3,4-epoxycyclohexyl)ether, 3,4-epoxycyclohexene carboxylic acid ethylene glycol diester, (3,4-epoxycyclohexyl)ethyl trimethoxysilane, Celloxide 8000 manufactured by Daicel Corp., and the like.

The content of the epoxy compound may be preferably 5 to 50 wt %, and more preferably 10 to 30 wt %, with respect to a total weight of the UV-curable ink composition. When the content exceeds 50 wt %, the coatability deteriorates, and when the content is less than 5 wt %, the sensitivity deteriorates.

The UV-curable ink composition includes an oxetane compound as another cationic polymerizable monomer.

The oxetane compound is a compound having a 4-membered cyclic ether group in a molecular structure thereof, and may serve to lower the viscosity of the cationically cured ink composition (for example, less than 50 cPs at 25° C.).

Specifically, it is possible to use 3-ethyl-3-hydroxymethyl oxetane, 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-(2-ethylhexyloxymethyl)oxetane, 3-ethyl-3-cyclohexyloxymethyl oxetane or phenol novolac oxetane, and the like. As the oxetane compound, it is possible to use, for example, 'ARON OXETANE OXT-101', 'ARON OXETANE OXT-121', 'ARON OXETANE OXT-211', 'ARON OXETANE OXT-221' or 'ARON OXETANE OXT-212', manufactured by Toagosei Co., Ltd., and the like. The oxetane compounds may be used either alone or in combination of two or more thereof.

The content of the oxetane compound may be preferably 15 to 75 wt %, and more preferably 40 to 60 wt %, with respect to the total weight of the UV-curable ink composition. When the content exceeds 75 wt %, the degree of cure is low, and when the content is less than 15 wt %, the viscosity is increased, and as a result, the coatability deteriorates.

Further, the oxetane compound of the present invention may be used while including an oxetane compound having one oxetane ring and an oxetane compound having two oxetane rings. When the oxetane compound having one oxetane ring and the oxetane compound having two oxetane rings are together used, there is an advantage in that the viscosity and the flexibility of the film may be adjusted. When two oxetane compounds are together used as described above, it is preferred to use the two oxetane compounds in a content range of the oxetane compound having one oxetane ring to the oxetane compound having two oxetane rings of 1:1.16 to 1:3.

Further, the present invention has a content ratio of the epoxy compound to the oxetane compound of 1:0.5 to 1:6. When the ratio of the epoxy compound and the oxetane compound exceeds 1:6, the coatability of the composition is excellent as the viscosity of the composition is low, but the curing sensitivity may deteriorate, and when the ratio is less than 1:0.5, the coatability may deteriorate as the viscosity of the composition is high.

The ink composition of the present invention includes a compound which produces a cationic species or a Bronsted acid by irradiation of UV rays as a cationic photopolymerization initiator, for example, an iodonium salt or a sulfonium salt, but the ink composition is not limited thereto.

The iodonium salt or sulfonium salt causes a curing reaction in which monomers having an unsaturated double bond contained in ink are reacted to form a polymer during the UV curing process to occur, and a photosensitizer may also be used according to the polymerization efficiency.

As an example, the photopolymerization initiator may be a photopolymerization initiator having an anion represented by $SbF_6^-$, $AsF_6^-$, $BF_6^-$, $(C_6F_5)_4B^-$, $PF_6^-$ or $RfnF_{6-n}^-$, but is not limited thereto.

The photopolymerization initiator may be included in an amount of preferably 1 to 15 wt %, and more preferably 2 to 10 wt %, with respect to the total weight of the UV-curable ink composition. When the content of the photopolymerization initiator is less than 1 wt %, the curing reaction is not sufficient, and when the content exceeds 15 wt %, the photopolymerization initiator is not all dissolved, or the viscosity is increased, and as a result, the coatability may deteriorate.

The UV-curable ink composition comprises a surfactant comprising a polar functional group in order to exhibit a small taper angle, or to lower the surface tension of the ink composition. The surfactant comprising the polar functional group may include one functional group selected from the group consisting of a carboxyl group, a hydroxy group, a phosphate, and a sulfonate.

Most of the silicone-based surfactants in the related art have an advantage in that the coatability to a base material is excellent, and the taper angle is small, but when a bezel part pattern is formed by applying an ink composition on a base material, and then a film on which an adhesive is applied, including a polarizing plate is attached thereto, an attaching force between the base material and the film deteriorates, and as a result, defects may occur. In contrast, non-silicone-based and fluorine-based surfactants have an advantage in that an attaching force between a bezel part formed on a base material and a film coated with an adhesive is excellent, and the film coated with the adhesive is not limited to a polarizing plate, or a Nichiban tape and a release film. In particular, a surfactant comprising a hydroxyl group (OH—) or a carboxyl group (COOH—), which includes a polar reactive group has high affinity for the adhesive components, and thus is particularly preferably used in terms of attaching force. It is more preferred to use a hydrophilic fluorine-based surfactant or a non-silicone-based surfactant, or a silicone-based surfactant comprising a hydroxyl group in order to improve the coatability to the base material.

Specifically, the surfactant may be a polymer-type or oligomer-type fluorine-based surfactant, and it is possible to use a surfactant which is not dissolved in a solvent which is very non-polar (the solubility parameter value is less than 15 $(MPa)^{0.5}$), for example, in hexane. Further, the surfactant may be a polymer-type or oligomer-type fluorine-based surfactant, and it is possible to use a surfactant which is not dissolved in an amount of 0.1 wt % or more in a solvent which is very polar (the solubility parameter value is 45 $(MPa)^{0.5}$ or more), for example, in water. In addition, the surfactant may be a polymer-type or oligomer-type fluorine-based surfactant, and it is possible to use a surfactant capable of being dissolved in an amount of 1 wt % or more in a solvent which is appropriately polar (the solubility parameter value is approximately 21 $(MPa)^{0.5}$), for example, in propylene glycol monomethyl ether and showing no phase separation. Furthermore, the surfactant may be a polymer-type or oligomer-type fluorine-based surfactant, and it is possible to use a surfactant capable of being dissolved in an amount of 0.1 wt % or more in a solvent which is also appropriately polar (the solubility parameter value is approximately 18 $(MPa)^{0.5}$), for example, in toluene and showing no phase separation. As the appropriate polar value, the solubility parameter value may be 15 to 21 $(MPa)^{0.5}$.

Further, the surfactant is preferably a polymer-type or oligomer-type fluorine-based surfactant, and it is possible to use a surfactant which is not dissolved in a solvent having a solubility parameter value of less than 15 $(MPa)^{0.5}$, is not dissolved in an amount of 0.1 wt % or more in a solvent having a solubility parameter value of 45 $(MPa)^{0.5}$ or more, and is dissolved in an amount of 1 wt % or more in a solvent having a solubility parameter value of 15 to 21 $(MPa)^{0.5}$ and shows no phase separation.

In addition, as the surfactant, a surfactant comprising a reactive hydroxy group as a silicone-based additive may be used. Furthermore, as the surfactant, a non-silicone-based surfactant which does not include a fluorine component may be used.

As the fluorine-based surfactant, the non-silicone-based surfactant, and the silicone-based surfactant comprising a hydroxyl group, commercially available products may be used, and for example, it is possible to use those selected from the group consisting of Megaface F-251, F-281, F-560, F-561, F-562, F-563, F-565, F-568, F-570 and F-571, which are manufactured by DaiNippon Ink & Chemicals (DIC), Inc., or Surflon S-111, S-112, S-113, S-121, S-131, S-132, S-141 and S-145, which are manufactured by Asahi Glass Co., Ltd., or Fluorad FC-93, FC-95, FC-98, FC-129, FC-135, FC-170C, FC-430 and FC-4430, which are manufactured by Sumitomo 3M, Co., Ltd., or Zonyl FS-300, FSN, FSN-100 and FSO, which are manufactured by Dupont Co., and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKE-TOL-AQ, BYK-DYNWET 800, and the like, which are manufactured by BYK Chemie.

The surfactant comprising the polar functional group is included in an amount of preferably 0.1 to 5.0 wt %, and more preferably 0.5 to 3.0 wt % with respect to the total weight of the UV-curable ink composition. There are problems in that when the content of the surfactant is less than 0.1 wt %, an effect of lowering the surface tension of the composition is not sufficient, and as a result, coating defects occur when the composition is coated, and when the content exceeds 5.0 wt %, the surfactant is used in an excessive amount, and as a result, the compatibility with the composition and the anti-foaming property are rather reduced.

The UV-curable ink composition includes a colorant.

As the colorant, one or more pigments, dyes, or mixtures thereof may be used, and the colorant is not particularly limited as long as the colorant may express a color if necessary.

As an exemplary embodiment of the present invention, it is possible to use carbon black, graphite, metal oxides, an organic black pigment, and the like as a black pigment.

Examples of carbon black may include SEAST SHIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corp.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-108OULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Colombia Carbon Co., Ltd.) or mixtures thereof, and the like.

As the organic black pigment, aniline black, lactam black or perylene black series, and the like may be used, but the organic black pigment is not limited thereto.

In the present invention, the UV-curable ink composition is cured by irradiation of UV rays with a long wavelength (for example, 365 or 395 nm), and thus has a certain level of optical density (OD). For this purpose, the content of the colorant may be preferably 1 to 15 wt %, and more preferably 3 to 10 wt %, with respect to the total weight of the UV-curable ink composition. When the content of the colorant is less than 1 wt %, a level of OD which may not be applied to the bezel is not exhibited, and when the content exceeds 15 wt %, an excessive amount of the colorant is not dispersed in ink, and a precipitate may be formed.

When the content of the colorant is within the range, the OD may be maintained in a range of 0.05 to 2.5 per a film thickness of 1.0 μm.

The ink composition may further include a colorant in order to improve the coatability by reducing the viscosity of the ink to increase the fluidity.

As the colorant, it is possible to use one or more selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 2-ethoxy ethanol, 3-methoxy butanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, but the diluent is not limited thereto.

The content of the colorant may be preferably 0 to 30 wt %, and more preferably 8 to 20 wt %, with respect to the total weight of the UV-curable ink composition. When the content exceeds 30 wt %, the curing sensitivity deteriorates.

The UV-curable ink composition may further include a photosensitizer in order to complement the curability in an active energy ray having a long wavelength.

The photosensitizer may be one or more selected from the group consisting of anthracene-based compounds, such as anthracene, 9,10-dibutoxy anthracene, 9,10-dimethoxy anthracene, 9,10-diethoxy anthracene, and 2-ethyl-9,10-dimethoxy anthracene; benzophenone-based compounds, such as benzophenone, 4,4-bis(dimethylamino)benzophenone, 4,4-bis (diethyl amino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; acetophenone; ketone-based compounds, such as dimethoxy acetophenone, diethoxy acetophenone, 2-hydroxy-2-methyl-1-phenylprop an-1-one, and propanone; perylene; fluorenone-based compounds, such as 9-fluorenone, 2-chloro-9-fluorenone, and 2-methyl-9-fluorenone; thioxanthone-based compounds, such as thioxanthone, 2,4-diethylthioxanthone, 2-chlorothioxanthone, 1-chloro-4-propyloxythioxanthone, isopropylthioxanthone (ITX) and diisopropylthioxanthone; xanthone-based compounds, such as xanthone and 2-methylxanthone; anthraquinone-based compounds, such as anthraquinone, 2-methyl anthraquinone, 2-ethyl anthraquinone, t-butyl anthraquinone and 2,6-dichloro-9,10-anthraquinone; acridine-based compounds, such as 9-phenylacridine, 1,7-bis(9-acridinyl)heptane, 1,5-bis(9-acridinyl)pentane and 1,3-bis(9-acridinyl)propane; dicarbonyl compounds, such as benzyl, 1,7,7-trimethyl-bicyclo[2,2,1]heptane-2,3-dione and 9,10-phenanthrenequinone; phosphine oxide-based compounds, such as 2,4,6-trimethylbenzoyl diphenylphosphine oxide and bis(2,6-dimethoxybenzoyl)-2,4,4-trimethylpentyl phosphine oxide; benzoate-based compounds, such as methyl-4-(dimethylamino)benzoate, ethyl-4-(dimethylamino)benzoate, and 2-n-butoxyethyl-4-(dimethylamino)benzoate; amino synergists, such as 2,5-bis(4-diethylaminobenzal)cyclopentanone, 2,6-bis(4-diethylaminobenzal)cyclohexanone and 2,6-bis(4-diethylaminobenzal)-4-methyl-cyclohexanone; coumarin-based compounds, such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-benzopyrano [6,7,8-ij]-quinolizin-11-one; chalcone compounds, such as 4-diethylaminochalcone and 4-azidobenzalacetphenone; 2-benzoylmethylene; and 3-methyl-b-naphthothiazoline.

The photosensitizer is included in an amount of preferably 1 to 200 parts by weight, and more preferably 10 to 100 parts by weight, with respect to 100 parts by weight of the photopolymerization initiator. There are problems in that when the content is less than 1 part by weight, the curing sensitivity synergistic action may not be expected at a desired wavelength, and when the content exceeds 200 parts by weight, the photosensitizer is not dissolved and the adhesive force of the pattern and the crosslinking density deteriorate.

The UV-curable ink composition may further include an adhesion promoter as an additive.

The film attached on the bezel pattern repeatedly shrinks and expands depending on the use conditions such as temperature and humidity, so that stress is imposed on the bezel pattern, and as a result, the film and the bezel may fall off from the base material. When one or more silane-based compounds selected from the group consisting of amino silane-based compounds, alkoxy silane-based compounds, epoxy silane-based compounds, aminophenyl silane-based compounds, amino silane-based compounds, mercapto silane-based compounds, and vinyl silane-based compounds are used as an adhesion promoter in order to prevent the fall-off, an excellent result may be exhibited.

Among them, epoxy silane-based compounds are more preferred as the adhesion promoter of the present invention.

In an exemplary embodiment of the present invention, excellent adhesion force was exhibited between a bezel pattern and a glass base material by using an epoxy silane-based compound as the adhesion promoter. Specifically, the adhesive force to a glass base material after the UV-curable ink composition of the present invention may be 4B or higher according to the ASTM D3359 standard.

The adhesion promoter is included in an amount of preferably 0.1 to 15 wt %, and more preferably 2 to 10 wt %, with respect to the total weight of the ink composition. There are problems in that when the content is less than 0.1 wt %, the bezel pattern cannot be prevented from being peeled off from the glass base material, and when the content exceeds 15 wt %, the viscosity of the ink solution is increased, and the dispersibility is low.

The UV-curable ink composition used in the present invention spreads within a short period of time immediately after inkjet printing, and thus exhibits excellent coating film characteristics, and the composition is cured to exhibit excellent adhesive characteristics. The excellent spreadability of the UV-curable ink composition of the present invention may be specifically exhibited as a contact angle with respect to a glass base material of less than 10°. Therefore, when the UV-curable ink composition is applied, it is preferred to dispose a UV-lamp right behind the inkjet head such that the ink composition may be cured simultaneously with the inkjet printing.

The dose for curing the UV-curable ink composition is 1 to 10,000 $mJ/cm^2$, preferably 80 to 2,000 $mJ/cm^2$.

The UV-curable ink composition is cured by absorbing radiation in a wavelength range of 250 nm to 450 nm, preferably 360 nm to 410 nm.

The UV-curable ink composition has a viscosity of 1 cP to 50 cP at 25° C., more preferably 3 cP to 45 cP at 25° C. as an example, and thus is suitable for the inkjet process. The process temperature means a temperature heated such that the curable ink composition can be smoothly discharged through the inkjet head. The process temperature may be 10° C. to 100° C., preferably 20° C. to 70° C.

The adhesion force of the bezel pattern formed by using the UV-curable ink composition of the present invention with respect to the glass base material is 4B or higher according to the ASTM D3359 standard, and the adhesion force and coatability of the bezel pattern are excellent.

Further, since the UV-curable ink composition comprises a surfactant comprising a polar functional group, a bezel pattern formed according to the present invention has excellent attaching force to a film base material on which an adhesive is applied. Specifically, the attaching force of the bezel after the UV-curable ink composition of the present invention is cured to the film base material on which the adhesive is applied may have a value of 100 to 5,000 gf/25 mm based on a peel-strength by a 180° peel-test.

The top portion of a bezel pattern formed by using the UV-curable ink composition is attached to a polarizing plate through an adhesive layer for a polarizing plate, and since the UV-curable ink composition exhibits excellent attaching force to an adhesive for a film, such as an acrylic adhesive, a styrene butadiene rubber-based adhesive, an epoxy adhesive, a polyvinyl alcohol-based adhesive, and a polyurethane-based adhesive, it is possible to obtain an effect in which the attaching force between the bezel pattern and the film on which the adhesive is applied, including a polarizing plate is improved when the UV-curable ink composition is used. In the present invention, the upper base material is not limited to a polarizing plate or a protective film.

Since the attaching force may be differently measured depending on the type of adhesive applied on the film, the standard for measuring the attaching force between the bezel pattern and the upper base material, described in the present invention employs peel-strength values measured by using a Nichiban CT-24 tape used in the Japanese Industrial Standard JIS Z 1522 as a standard. At this time, attaching force characteristics in that the attaching force between the bezel pattern and the upper base material has a range of 100 to 5,000 gf/25 mm belong to the feature category of the present invention.

The method for producing a bezel pattern of a display substrate according to the present invention uses the UV-curable ink composition.

Specifically, the method for producing a bezel pattern of a display substrate according to the present invention includes: a) forming a bezel pattern on a substrate by using the UV-curable ink composition; and b) curing the bezel pattern.

In addition, the method for producing a bezel pattern of a display substrate according to the present invention may further include cleaning and drying the substrate prior to a) the forming of the bezel pattern. The cleaning and drying is for selectively carrying out a surface treatment depending on the surface energy of the substrate in order to improve coating properties of the ink and remove stains caused by foreign substances.

Specifically, the surface treatment may be carried out by a treatment such as a wet surface treatment, a UV ozone treatment, and a normal pressure plasma treatment.

As the method for forming a bezel pattern on the substrate, it is possible to use a method selected from an inkjet printing using a UV-curable resin instead of photolithography and screen printing, a gravure coating, and a reverse offset coating. In order to applying the method, the ink composition of the present invention may have a viscosity of 1 cP to 50 cP, and preferably 3 cP to 45 cP.

In order to form a bezel pattern on a specific portion of the substrate by the aforementioned method, the ink composition having a low viscosity of 1 cP to 50 cP is applied at a height of 0.1 to 20 µm, and more specifically 0.5 to 5 µm. The applied composition is cured by exposure including UV rays, and as a result, a bezel pattern having a thin film thickness of 0.1 to 20 µm, and more specifically 0.5 to 5 µm may be manufactured.

The UV-curable ink composition used in the present invention spreads within a short period of time immediately after inkjet printing, and thus exhibits excellent coating film characteristics, and the composition is cured to exhibit excellent adhesive characteristics. The excellent spreadability of the UV-curable ink composition of the present invention may be specifically exhibited as a contact angle with respect to a glass base material of less than 10°. Therefore, when the UV-curable ink composition is applied, it is preferred to dispose a UV-lamp right behind the inkjet head such that the ink composition may be cured simultaneously with the inkjet printing.

In the present invention, examples of a light source for curing the UV-curable composition include a mercury vapor arc, a carbon arc, a Xe arc, an LED curing device, and the like, which emit a light with a wavelength of 250 nm to 450 nm, but are not limited thereto.

The bezel pattern has a taper angle of more than 0° and 30° or less and a thickness of 0.1 µm to 20 µm, which are measured after a curing treatment. Further, the taper angle may be preferably more than 0° and 10° or less. In addition, the thickness may be preferably 0.5 µm to 5 µm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 per a film thickness of 1.0 µm, and 0.25 to 1.0, if necessary. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

Further, since the UV-curable ink composition of the present invention comprises a surfactant comprising a polar functional group, a bezel pattern formed according to the present invention has excellent attaching force to a polarizing plate. Specifically, the upper portion attaching force of the UV-curable ink composition of the present invention after being cured may have a value of 100 to 5,000 gf/25 mm In the bezel pattern formed according to the present invention, the adhesion force to the glass base material is 4B or higher according to the ASTM D3359 standard, which is excellent.

The present invention provides a bezel pattern of a display substrate, which is manufactured by the method. The bezel pattern in the present invention refers to a pattern formed at the edge portion of various devices such as a clock and a display device.

The bezel pattern has a taper angle of more than 0° and 30° or less and a thickness of 0.1 µm to 20 µm, which are measured after a curing treatment. Further, the taper angle may be preferably more than 0° and 10° or less. In addition, the thickness may be preferably 0.5 µm to 5 µm. The bezel pattern of the present invention has the aforementioned features, and thus may not exhibit a short-circuit due to a large step difference and deterioration in appearance quality due to generation of bubbles and release of the film.

The optical density of the bezel pattern may be 0.1 to 5 based on a film thickness of 2.0 µm, and 0.5 to 2, if necessary. In this case, there is an advantage in that shielding characteristics due to the bezel pattern are excellent. When the optical density exceeds 5, the manufacture of ink and the inkjet process may be adversely affected because a required content of pigment to be introduced is very high, and it is possible to inhibit the UV-curable ink composition from being cured by radiation.

Further, since the UV-curable ink composition of the present invention comprises a surfactant comprising a polar functional group, a bezel pattern formed according to the present invention has excellent attaching force to a polarizing plate. Specifically, the upper portion attaching force of the UV-curable ink composition of the present invention after being cured may have a value of 100 to 5,000 gf/25 mm In the bezel pattern, the adhesion force to the glass base material after curing treatment is 4B or higher according to the ASTM D3359 standard, which is excellent.

Furthermore, the present invention provides a display substrate including the bezel pattern.

The display device may be a display device used in any one of a plasma display panel (PDP), a light emitting diode (LED), an organic light emitting diode (OLED), a liquid crystal display (LCD) device, a thin film transistor-liquid crystal display (LCD-TFT) device, and a cathode ray tube (CRT).

MODE FOR INVENTION

Hereinafter, the present invention will be described in detail with reference to the Examples. The following Examples are provided for describing the present invention, and the scope of the present invention includes the scope described in the following claims and the substitution and modification thereof, and is not limited to the scope of the Examples.

EXAMPLES

The compositions for forming a bezel pattern in Examples 1 to 4 and Comparative Examples 1 to 2 were prepared by mixing the compositions as in the following Table 1 and stirring the compositions for 3 hours.

TABLE 1

|  | Colorant A | Epoxy B | Oxetane C | Polymer-ization initiator D | Surfactant E | Adhesion promoter F |
|---|---|---|---|---|---|---|
| Example |  |  |  |  |  |  |
| 1 | A1: 3 | B1: 15 | C1: 77 | D1: 3 | E1: 1 | F1: 1 |
| 2 | A1: 3 | B1: 15 | C1: 77.5 | D1: 3 | E2: 0.5 | F1: 1 |
| 3 | A1: 5 | B1: 25 | C1: 64.5 | D1: 3 | E3: 1.5 | F2: 1 |
| 4 | A1: 3 | B1: 15 | C1: 77 | D1: 3 | E4: 1 | F3: 1 |
| Comparative Example |  |  |  |  |  |  |
| 1 | A1: 3 | B1: 15 | C1: 78 | D1: 3 | — | F3: 1 |
| 2 | A1: 3 | B1: 15 | C1: 73 | D1: 3 | E5: 5 | F3: 1 |

A1: Carbon black
B1: Celloxide 2021P (Daicel Corp.)
C1: ARON OXETANE 221 (Toagosei Co., Ltd.)
D1: SP-150 (Asahi Denka)
E1: RS-75 (DIC)
E2: BYK-388 (BYK Chemie)
E3: F-484 (DIC)
E4: BYK-3441 (BYK Chemie)
E5: BYK-330 (BYK Chemie)
F1: 2-(3,4-epoxycyclohexyl)ethyltrimethoxy silane
F2: 3-methacryloxypropyl triethoxysilane
F3: 3-methacryloxyoctyl trimethoxysilane <Preparation Example 1> Manufacture of Bezel Pattern The compositions prepared in Examples 1 to 4 and Comparative Examples 1 and 2 were cured on a cleaned LCD glass base material, and then were coated by the inkjet coating method so as to have a thickness of 2 μm after the compositions were cured. Bezel patterns were formed by irradiating ultraviolet rays on the coating layer under the following conditions within 1 minute after the coating in order to prevent foreign substances from being attached and curing the compositions. As a UV ray irradiation device, a high-pressure mercury lamp having a wide ultraviolet ray emission wavelength region, or the like was used. After a UV ray of 1,000 mJ/cm$^2$ was irradiated, latex gloves were worn in order to determine whether the bezel pattern was cured, and then the indentation and tack sense were observed by pressing the bezel pattern.

<Preparation Example 2> Manufacture of Display Device Using Bezel Pattern

A bezel pattern was formed on the upper surface of the display panel (hereinafter, referred to as the panel) by the method in Preparation Example 1, and as an upper base material, an NRT polarization film manufactured by LG Chem., which used an acrylic adhesive layer, was attached thereto. After the attachment, the surroundings thereof were capped by a sealant in order to prevent moisture and foreign substance from being incorporated into the gap between the polarization film and the pattern.

<Experimental Example 1>: Viscosity

For the compositions prepared in Examples 1 to 4 and Comparative Examples 1 and 2, viscosities were measured. As a viscosity measurement apparatus, DV-III+ manufactured by Brookfield Industries, Inc. was used.

<Experimental Example 2>: Measurement of Curing Sensitivity

In order to measure the curing sensitivity of the bezel pattern manufactured according to Preparation Example 1, latex gloves were worn at the time point when 5 minutes elapsed after the irradiation of UV rays, and then the state of the surface was confirmed by pressing the bezel pattern.
○: The bezel pattern was not sticky, and completely cured
Δ: The bezel pattern was cured, but was sticky
x: The bezel pattern was insufficiently cured, and as result, unreacted residues were spotted <Experimental Example 3>: Evaluation of Spreadability The compositions prepared in Examples 1 to 4 and Comparative Examples 1 and 2 were applied on a cleaned LCD glass base material, and then the contact angles were measured.

<Experimental Example 4>: Evaluation of Attaching Force Between Film/Bezel Pattern A polarization film having a width of 25 mm and a length of 50 to 100 mm in size, on which an adhesive layer was applied, was attached to a bezel pattern at normal temperature by using a roll laminator. A 180° peel test was carried out and the results of measuring a peel strength when the film was peeled off from the bezel are shown in the following Table 2.

<Experimental Example 5>: Cross-Hatch Adhesion Force

According to the ASTM D3359 standard which is a cross-cut test standard of the bezel pattern manufactured in Preparation Example 1, a cross-cut test was performed. Before the cross-cut test was performed, a heat treatment may be performed at a temperature of 60° C. for 1 minute in order to facilitate the reaction of the adhesion promoter according to the samples. Specifically, on a test sample, 11 lines were each scratched at an interval of 1 mm in the cross and machine directions to form 100 square lattices having a length and breadth of 1 mm each. And then, a CT-24 adhesive tap manufactured by Nichiban Co., Ltd. was attached to the cut surface, and then at the time of detaching the tape, the state of the surface which was falling apart together was measured to evaluate the state according to the following standard.

Evaluation Standard of Cross-Hatch Adhesive Force

5B: Case where no surface fell apart
4B: Case where the area of the fallen surface was within 5% compared to the total surface
3B: Case where the area of the fallen surface was 5 to 15% compared to the total surface
2B: Case where the area of the fallen surface was 15 to 35% compared to the total surface
1B: Case where the area of the fallen surface was 35 to 65% compared to the total surface
0B: Case where almost all the surface was fallen apart

TABLE 2

| Example Conditions | Viscosity (cP) | Whether cured or not 5 minutes after UV irradiation, O: tack-free Δ: Tack sense X: Unreacted | Spread-ability Contact angle O: <10° Δ: 10° to 30° X: >30° | Upper portion attaching force peel test (Nichiban tape) | Adhesion force (at 5 minutes) Cross cut test |
|---|---|---|---|---|---|
| 1 | 16 | O | O | 500~1500 | 4B |
| 2 | 16 | O | O | 1500~2500 | 4B |
| 3 | 24 | O | O | 500~1000 | 4B |
| 4 | 16 | O | O | 1000~1500 | 4B |
| Comparative Example | | | | | |
| 1 | 16 | O | X | 10~200 | 4B |
| 2 | 15 | O | O | 10~50 | 4B |

As a result of the experiments, the ink compositions in Examples 1 to 4 in which a surfactant comprising a polar functional group was used exhibited low contact angles and high upper portion attaching forces, whereas there are problems in that the ink compositions in Comparative Examples 1 and 2, in which a surfactant comprising no polar functional group was used, exhibited high contact angle and had low upper portion attaching force, respectively.

The invention claimed is:

1. A UV-curable ink composition for forming a bezel pattern comprising a colorant, an epoxy compound, an oxetane compound, a photopolymerization initiator, a surfactant comprising a polar functional group, and an adhesion promoter,
   wherein a content ratio of the epoxy compound to the oxetane compound is 1:2.58 to 1:6, an adhesive force to a glass base material after curing is 4B or higher according to the ASTM D3359 standard, a contact angle with respect to a glass base material is less than 10°, and an upper portion attaching force after curing is 100 to 5,000 gf/25 mm, and
   wherein the adhesion promoter is one or more silane-based compounds selected from the group consisting of amino silane-based compounds, alkoxy silane-based compounds, epoxy silane-based compounds, aminophenyl silane-based compounds, amino silane-based compounds, mercapto silane-based compounds, and vinyl silane-based compounds.

2. The UV-curable ink composition of claim 1, further comprising one or more selected from the group consisting of a colorant, and a photosensitizer.

3. The UV-curable composition of claim 1, wherein the surfactant comprising the polar functional group comprises one functional group selected from the group consisting of a carboxyl group, a hydroxy group, a phosphoric acid group, and a sulfonic acid group.

4. The UV-curable composition of claim 3, wherein the surfactant is a polymer-type or oligomer-type fluorine-based surfactant, and the surfactant is not dissolved in a solvent having a solubility parameter value of less than 15 $(MPa)^{0.5}$, is not dissolved in an amount of 0.1 wt % or more in a solvent having a solubility parameter value of 45 $(MPa)^{0.5}$ or more, and is dissolved in an amount of 1 wt % or more in a solvent having a solubility parameter value of 15 to 21 $(MPa)^{0.5}$ and shows no phase separation.

5. The UV-curable composition of claim 4, wherein the solvent having a solubility parameter value of less than 15 $(MPa)^{0.5}$ is hexane, the solvent having a solubility parameter value of 45 $(MPa)^{0.5}$ or more is water, and the solvent having a solubility parameter value of 15 to 21 $(MPa)^{0.5}$ is propylene glycol monomethyl ether (PGME) or toluene.

6. The UV-curable composition of claim 3, wherein the surfactant is a surfactant comprising a reactive hydroxy group as a silicone-based additive.

7. The UV-curable composition of claim 3, wherein the surfactant is a non-silicone-based surfactant which does not comprise a fluorine component.

8. The UV-curable composition of claim 3, wherein the surfactant comprising the polar functional group is comprised in an amount of 0.1 to 5.0 wt % with respect to a total weight of the UV-curable ink composition.

9. The UV-curable composition of claim 1, wherein the oxetane compound comprises an oxetane compound having one oxetane ring and an oxetane compound having two oxetane rings.

10. The UV-curable composition of claim 9, wherein a content ratio of the oxetane compound having one oxetane ring to the oxetane compound having two oxetane rings is 1:16 to 1:3.

11. The UV-curable composition of claim 1, wherein a content of the epoxy compound is 5 to 50 wt % with respect to the total weight of the UV-curable ink composition.

12. The UV-curable composition of claim 1, wherein a content of the oxetane compound is 15 to 75 wt % with respect to the total weight of the UV-curable ink composition.

13. The UV-curable composition of claim 1, wherein the photopolymerization initiator is an iodonium salt or a sulfonium salt.

14. The UV-curable composition of claim 1, wherein a content of the photopolymerization initiator is 1 to 15 wt % with respect to the total weight of the UV-curable ink composition.

15. The UV-curable composition of claim 1, wherein a content of the colorant is 1 to 15 wt % with respect to the total weight of the UV-curable ink composition.

16. The UV-curable composition of claim 2, wherein a content of the colorant is 0 to 30 wt % with respect to the total weight of the UV-curable ink composition.

17. The UV-curable composition of claim 2, wherein the photosensitizer is comprised in an amount of 1 to 200 parts by weight with respect to 100 parts by weight of the photopolymerization initiator.

18. The UV-curable composition of claim 1, wherein the adhesion promoter is comprised in an amount of 0.1 to 15 wt % with respect to the total weight of the UV-curable ink composition.

19. The UV-curable composition of claim 1, wherein a dose for curing the UV-curable ink composition is 1 to 10,000 mJ/cm$^2$.

20. The UV-curable composition of claim 1, wherein the UV-curable ink composition has a viscosity of 1 cp to 50 cp at 25° C.

21. The UV-curable composition of claim 1, wherein the UV-curable ink composition has a taper angle of 0° to 30° after being cured.

22. The UV-curable composition of claim 1, wherein the UV-curable ink composition is for forming a bezel pattern.

23. A method for producing a bezel pattern for a display substrate, comprising:
   a) forming a bezel pattern on a substrate by using the UV-curable ink composition of claim 1; and
   b) curing the bezel pattern.

24. The method of claim 23, wherein the method of forming the bezel pattern on the substrate in Step a) is a method selected from an inkjet printing, a gravure coating, and a reverse offset coating.

25. A bezel pattern for a display substrate, which is formed on a substrate by curing the UV-curable ink composition of claim 1.

* * * * *